US011275876B2

(12) United States Patent
Tsuda et al.

(10) Patent No.: US 11,275,876 B2
(45) Date of Patent: Mar. 15, 2022

(54) PROGRAM, INFORMATION PROCESSING DEVICE, AND INFORMATION PROCESSING METHOD

(71) Applicant: RENESAS ELECTRONICS CORPORATION, Tokyo (JP)

(72) Inventors: Tetsuji Tsuda, Tokyo (JP); Teruki Fukuyama, Tokyo (JP); Toshio Sunami, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 316 days.

(21) Appl. No.: 16/400,872

(22) Filed: May 1, 2019

(65) Prior Publication Data
US 2019/0354646 A1 Nov. 21, 2019

(30) Foreign Application Priority Data
May 15, 2018 (JP) .............................. JP2018-093854

(51) Int. Cl.
*G06F 1/08* (2006.01)
*G06F 30/20* (2020.01)

(52) U.S. Cl.
CPC ............... *G06F 30/20* (2020.01); *G06F 1/08* (2013.01)

(58) Field of Classification Search
CPC .......... G06F 1/08; G06F 1/3206; G06F 1/324; G06F 17/5009; G06F 30/20

USPC .................................................. 703/1, 6, 13
See application file for complete search history.

(56) References Cited

U.S. PATENT DOCUMENTS

| 7,890,924 B2* | 2/2011 | Raffo ..................... G06Q 10/06 |
| | | 717/105 |
| 2008/0221777 A1 | 9/2008 | Degaki |
| 2018/0113964 A1* | 4/2018 | Fischer .................. G06F 30/20 |
| 2019/0138671 A1* | 5/2019 | Funabashi .......... G05B 23/0243 |

FOREIGN PATENT DOCUMENTS

JP         2008-215254 A        9/2008

* cited by examiner

*Primary Examiner* — Hoan H Tran
(74) *Attorney, Agent, or Firm* — McDermott Will & Emery LLP

(57) ABSTRACT

A program is executed in an information processing device including a processor and a memory. The program allows the processor to execute a step of, on the basis of a simulation result of a model in the case where a series of blocks having an input block, one or more operation blocks, and an output block are allowed to operate at a predetermined clock frequency, deciding a new clock frequency of a target block that is allowed to operate at a clock frequency lower than the predetermined clock frequency, and a step of setting the conversion ratios of conversion blocks so as to execute a simulation of the model in which the target block is allowed to operate at the new clock frequency lower than the predetermined clock frequency and the remaining blocks are allowed to operate at the predetermined clock frequency.

19 Claims, 11 Drawing Sheets

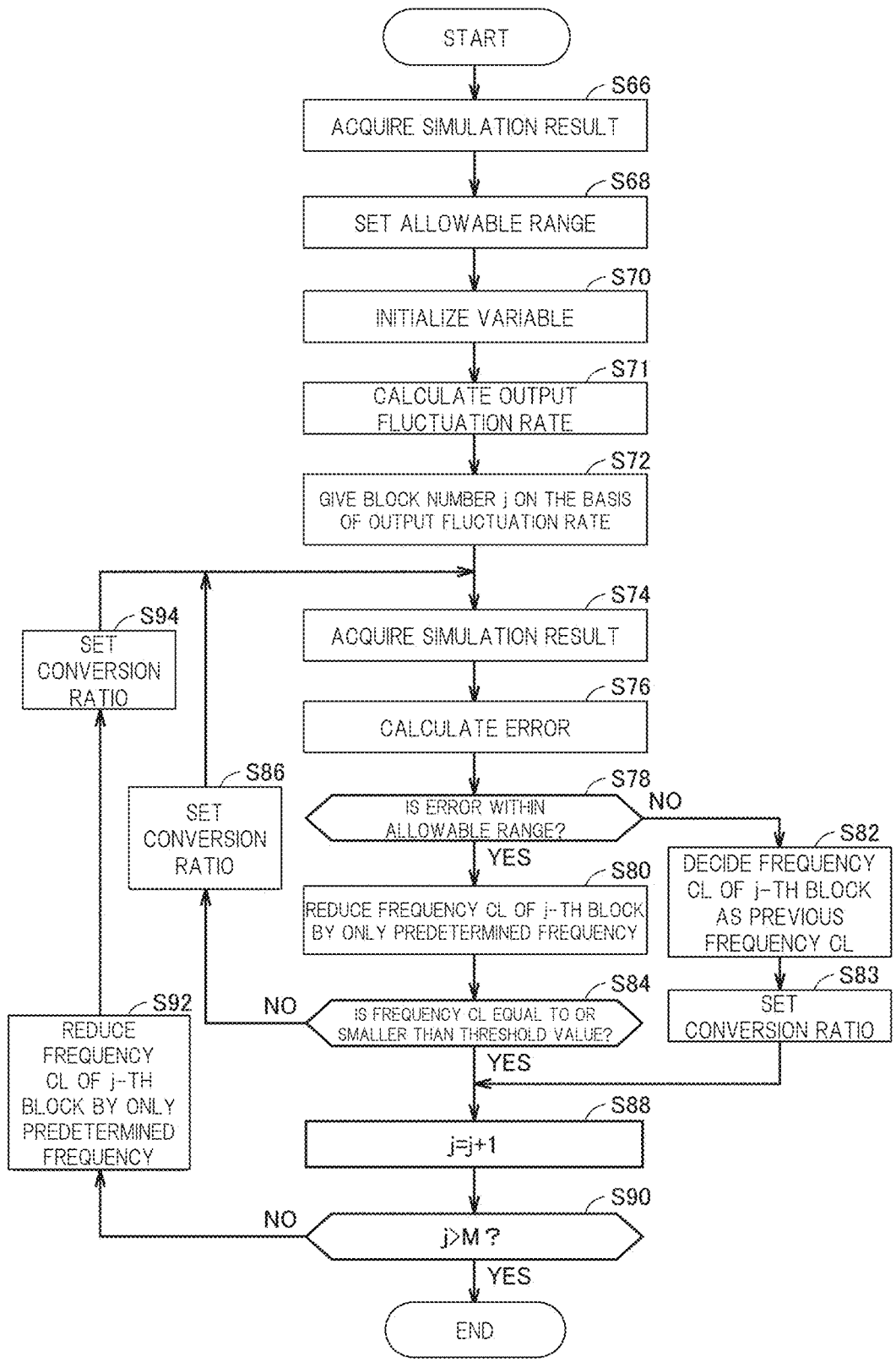

PROGRAM, INFORMATION PROCESSING DEVICE, AND INFORMATION PROCESSING METHOD

CROSS-REFERENCE TO RELATED APPLICATIONS

The disclosure of Japanese patent application no. 2018-093854 filed on May 15, 2018 including the specification, drawings and abstract is incorporated herein by reference in its entirety.

BACKGROUND

The disclosure relates to a program, an information processing device, and an information processing method, and to, for example, a program, an information processing device, and an information processing method used in a simulation of a model in model base development.

A system is developed using a process of a V model in some cases in system development. In the V model, for example, the development is advanced in such a manner that in a process before a coding process, a developer creates a document, an expert reviews the same, and the reviewed result is input in the next process.

However, due to an increase in scale and complication of a system, there is a case where a problem that cannot be solved by only the review of the document occurs in a system test in which the behavior and performance of the system in the last stage are confirmed. Because the behavior and performance of the system are different between a simple calculation on the basis of the document and an actual system. In this case, the development needs to be carried out again from the beginning of the V model, causing a delay in the development completion schedule and missing the product introduction timing. In order to solve such a problem, model base development using not only a document but also a model in a process before coding is spreading.

For example, Japanese Unexamined Patent Application Publication No. 2008-215254 discloses a simplifying method in model base development in which a particular simple model base different from a detailed model base is mounted in a vehicle ECU (engine control unit) for engine control. In this method, an adaptive value for adapting the simple model base to an actual machine is calculated backward in the simple model base, and a value necessary to calculate the adaptive value backward is calculated by the detailed model base.

SUMMARY

In the model base development, the development is advanced in such a manner that a model configured using a plurality of blocks is created in each process, a simulation of the model is performed, and the behavior and performance are estimated. The simulation of the model can estimate the behavior and performance of the system more accurately than a theoretical simple calculation. In addition, a failure pattern that hardly or cannot occur in an actual system can be also reproduced.

Thus, a simulation is executed many times under various conditions in order to confirm the behavior and performance of the system in the model base development. However, as the model becomes more accurate, the simulation time becomes disadvantageously longer. In Japanese Unexamined Patent Application Publication No. 2008-215254, since the calculation time of the vehicle ECU is enormously increased, the simple model base different from the detailed model base is used. However, for example, complicated work of changing the configuration of the simple model in accordance with the desired reduction amount of simulation time is needed, and thus the simulation time cannot be easily reduced.

The other problems and novel features will become apparent from the description of the specification and the accompanying drawings.

A program according to an embodiment is executed in an information processing device including a processor and a memory. The program allows the processor to execute a step of, on the basis of a simulation result of a model in the case where a series of blocks having an input block, one or more operation blocks, and an output block are allowed to operate at a predetermined clock frequency, deciding a new clock frequency of a target block that is allowed to operate at a clock frequency lower than the predetermined clock frequency. The program allows the processor to further execute a step of setting the conversion ratios of conversion blocks so as to execute a simulation of the model in which the target block is allowed to operate at the new clock frequency lower than the predetermined clock frequency and the remaining blocks are allowed to operate at the predetermined clock frequency.

An information processing device according to an embodiment includes a processor and a memory. On the basis of a simulation result of a model in the case where a series of blocks having an input block, one or more operation blocks, and an output block are allowed to operate at a predetermined clock frequency, the processor decides a new clock frequency of a target block that is allowed to operate at a clock frequency lower than the predetermined clock frequency. The processor sets the conversion ratios of conversion blocks arranged among the blocks so as to execute a simulation of the model in which the target block is allowed to operate at the new clock frequency lower than the predetermined clock frequency and the remaining blocks are allowed to operate at the predetermined clock frequency.

An information processing method according to an embodiment is executed by a processor of an information processing device. The information processing method includes a step of, on the basis of a simulation result of a model in the case where a series of blocks having an input block, one or more operation blocks, and an output block are allowed to operate at a predetermined clock frequency, deciding a new clock frequency of a target block that is allowed to operate at a clock frequency lower than the predetermined clock frequency. The information processing method further includes a step of setting the conversion ratios of conversion blocks so as to execute a simulation of the model in which the target block is allowed to operate at the new clock frequency lower than the predetermined clock frequency and the remaining blocks are allowed to operate at the predetermined clock frequency.

According to the embodiment, the simulation time can be easily reduced in model base development.

BRIEF DESCRIPTION OF THE DRAWINGS

FIG. 11 is a flowchart for showing an example of a processing procedure of a processor according to the third embodiment.

DETAILED DESCRIPTION

Figure 1:
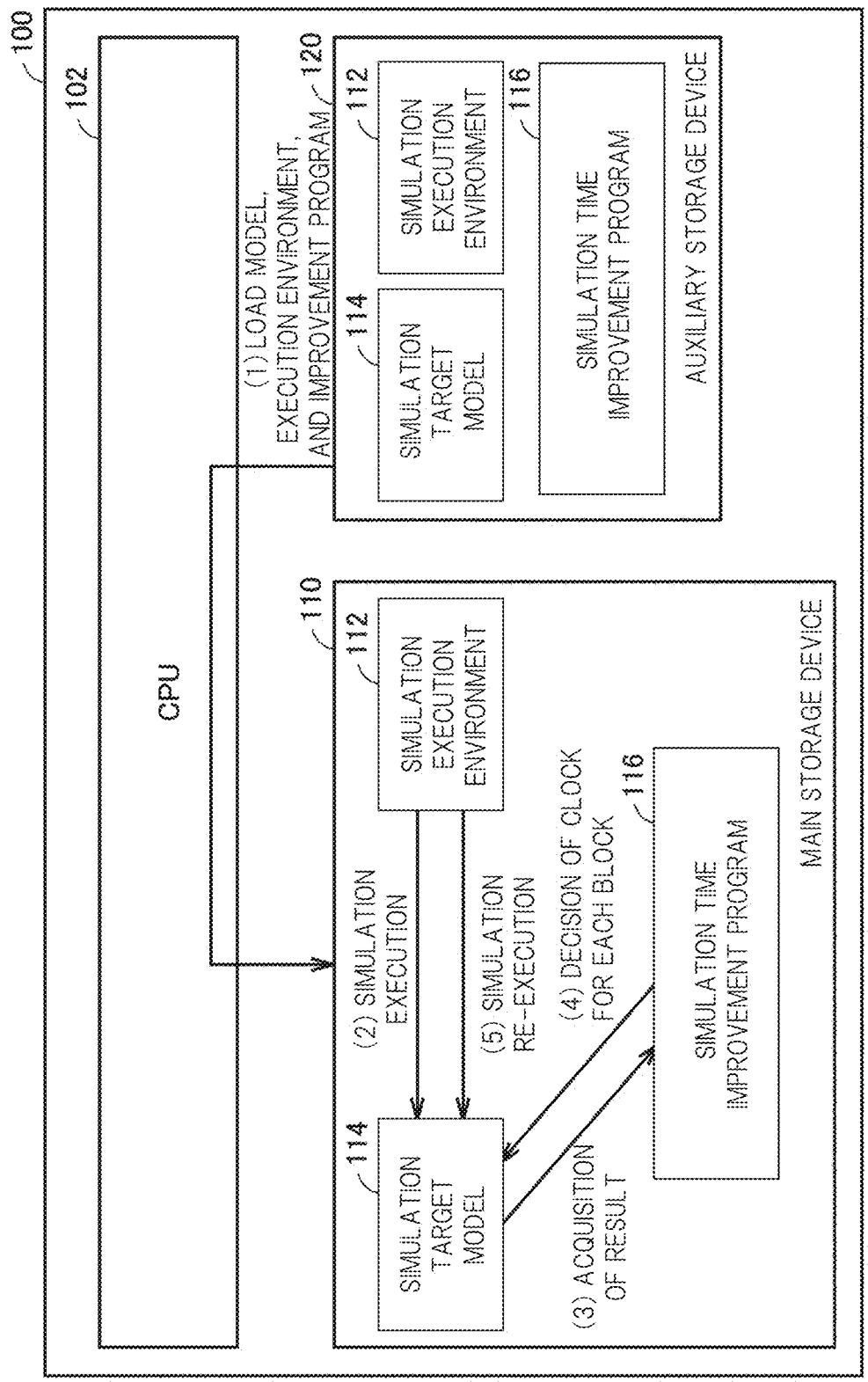
FIG. 1 is a diagram for explaining a hardware configuration and an operation outline of an information processing device according to an embodiment.

Hereinafter, each embodiment will be described in detail with reference to the drawings. It should be noted that the same or corresponding parts will be followed by the same reference numerals, and the explanations thereof will not be repeated.

FIG. 1 is a diagram for explaining a hardware configuration and an operation outline of an information processing device 100 according to an embodiment. With reference to FIG. 1, the information processing device 100 includes a processor 102, an auxiliary storage device 120, and a main storage device 110. The information processing device 100 may be configured to include various input devices (for example, a keyboard, buttons, and a mouse) for accepting an operation input to the information processing device 100, a display for displaying various information, and a communication interface for communicating various data.

The information processing device 100 according to the embodiment is, for example, a stationary personal computer including a display. However, the information processing device 100 is not limited to this, but may be a device having an operation function to be described later such as a laptop personal computer.

The processor 102 is typically an operation processing unit such as a CPU (Central Processing Unit). The processor 102 reads an OS (Operating System) and various programs including application programs installed in the auxiliary storage device 120, and executes the same while being expanded to the main storage device 110.

The main storage device 110 is typically a volatile storage medium such as a DRAM (Dynamic Random Access Memory), and holds various work data necessary to execute various programs in addition to codes of various programs including an OS executed by the processor 102. The auxiliary storage device 120 is a non-volatile storage medium such as a hard disk or an SSD (Solid State Drive), and holds various design information in addition to various programs including an OS. It should be noted that the main storage device 110 and the auxiliary storage device 120 will be collectively referred to as a memory in the following description in some cases.

In the embodiment, the auxiliary storage device 120 stores a simulation execution environment program (hereinafter, also simply referred to as an "execution environment program") 112, a simulation target model (hereinafter, also simply referred to as a "model") 114, and a simulation time improvement program (hereinafter, also simply referred to as an "improvement program") 116.

The execution environment program 112 is a program for providing an execution environment of a simulation used for model base development, and is, for example, Simulink (registered trademark) that operates on MATLAB (registered trademark) of The MathWorks, Inc. (registered trademark).

A developer describes a model 114 of a target program using the execution environment program 112. The model 114 is described as a function unit called "block" and a combination of connections representing an input/output relation between the function units.

Figure 2:
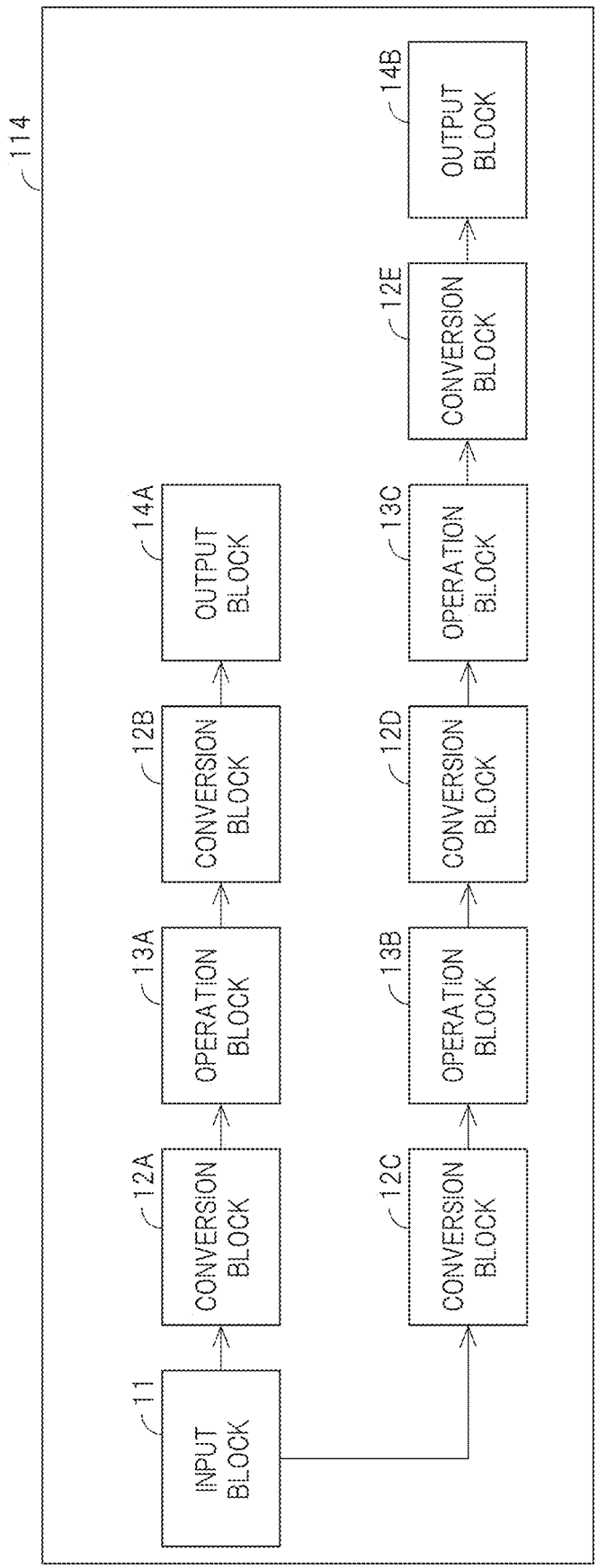
FIG. 2 is a diagram for showing an example of a model according to the embodiment.

FIG. 2 is a diagram for showing an example of the model 114 according to the embodiment. With reference to FIG. 2, the model 114 includes an input block 11, conversion blocks 12A to 12E, operation blocks 13A to 13C, and output blocks 14A and 14B. The model 114 is an assembly obtained by connecting these blocks using the connections representing an input/output relation.

In the following description, when explaining a configuration and a function common to each of the conversion blocks 12A to 12E, these are collectively referred to as a conversion block 12. When explaining a configuration and a function common to each of the operation blocks 13A to 13C, these are collectively referred to as an operation block 13. When explaining a configuration and a function common to each of the output blocks 14A and 14B, these are collectively referred to as an output block 14.

The input block 11 is a block that accepts an input of data from the outside of the model and outputs the data. For example, the input block 11 reads a file from the outside, and outputs the read value.

The conversion block 12 converts a clock frequency with a set conversion ratio. Specifically, the conversion block 12 converts a clock frequency that operates the block coupled to the input side of the conversion block 12 with a set conversion ratio, and outputs the converted frequency.

For example, in the case where the input block 11 is allowed to operate at a clock frequency of 50 Hz and the operation block 13A is allowed to operate at a clock frequency of 100 Hz, the conversion ratio of the conversion block 12A is set to "2". As described above, the clock frequency of the block coupled to the output side of the conversion block 12 to the clock frequency of the block coupled to the input side of the conversion block 12 is set as the conversion ratio of the conversion block 12.

The operation block 13 executes a predetermined operation for input data, and outputs the result. As an example, the operation block 13 executes four arithmetic operations for an input value, and outputs the result. As another example, the operation block 13 outputs 100 if an input value is within a preliminarily-set range (for example, 1≤input value≤10), and outputs an input value as it is if the input value is out of the preliminarily-set range. As still another example, the operation block 13 executes an integration process of an input value, and outputs the integration result.

The output block 14 is a block that outputs input data to the outside of the model. For example, the output block 14 executes writing to a file or outputs the waveform of voltage (or a current).

Typically, there are a series of blocks including one input block 11, one or more operation blocks 13, and one output block on a processing route from the input block 11 to the output block 14. In addition, the conversion blocks 12 are arranged among the blocks of the series of blocks.

In the example of FIG. 2, the model 114 has a processing route including a series of blocks including the input block 11, the operation block 13A, and the output block 14A and the conversion blocks 12A and 12B arranged among the blocks of the series of blocks. In addition, the model 114 has a processing route including a series of blocks including the input block 11, the operation blocks 13B and 13C, and the output block 14B and the conversion blocks 12C to 12E arranged among the blocks of the series of blocks.

An operation outline of the information processing device 100 according to the embodiment will be described with reference to FIG. 1 again. As main processes in the information processing device 100, there are five processes such as a program reading process (1), a simulation execution process (2), a simulation result acquisition process (3), a clock frequency decision process (4), and a simulation re-execution process (5). The numbers in parentheses of FIG. 1 correspond to the above processes.

In the program reading process, the processor 102 reads the execution environment program 112, the model 114, and the improvement program 116 from the auxiliary storage device 120, and loads the same to the main storage device 110.

In the simulation execution process, the processor 102 allows a series of blocks to operate at a predetermined clock frequency by executing the execution environment program 112, and executes a simulation of the model 114. In this case, the conversion ratio of each conversion block 12 is set to "1" (namely, the frequency conversion is not performed). In the simulation result acquisition process, the processor 102 executes the improvement program 116, and acquires the simulation result.

In the clock frequency decision process, the processor 102 executes the improvement program 116, and decides the optimum clock frequency for each of the series of blocks on the basis of the acquired simulation result. Specifically, the processor 102 analyzes the degree of reduction in the present clock frequency of each of the series of blocks within a range where the simulation result is not substantially affected on the basis of the simulation result, and decides the clock frequency of each block on the basis of the analysis result. In addition, the processor 102 sets the conversion ratio of each conversion block 12 arranged between the blocks on the basis of the clock frequency of each of the decided blocks.

Then, in the simulation re-execution process, the processor 102 re-executes the execution environment program 112 to execute a simulation of the model 114 with the clock frequency of each block changed.

As described above, since the clock frequency of at least one block is reduced in the simulation re-execution process, the simulation time in the simulation re-execution process becomes shorter than that in the simulation execution process. In addition, the clock frequency of each block is reduced within a range where the simulation result is not substantially affected, and thus the accuracy of the simulation result can be also secured. Accordingly, the simulation time can be easily reduced by using the improvement program 116 while securing the accuracy of the simulation result. Hereinafter, each embodiment will be described in detail.

First Embodiment

<Functional Configuration>

Figure 3:
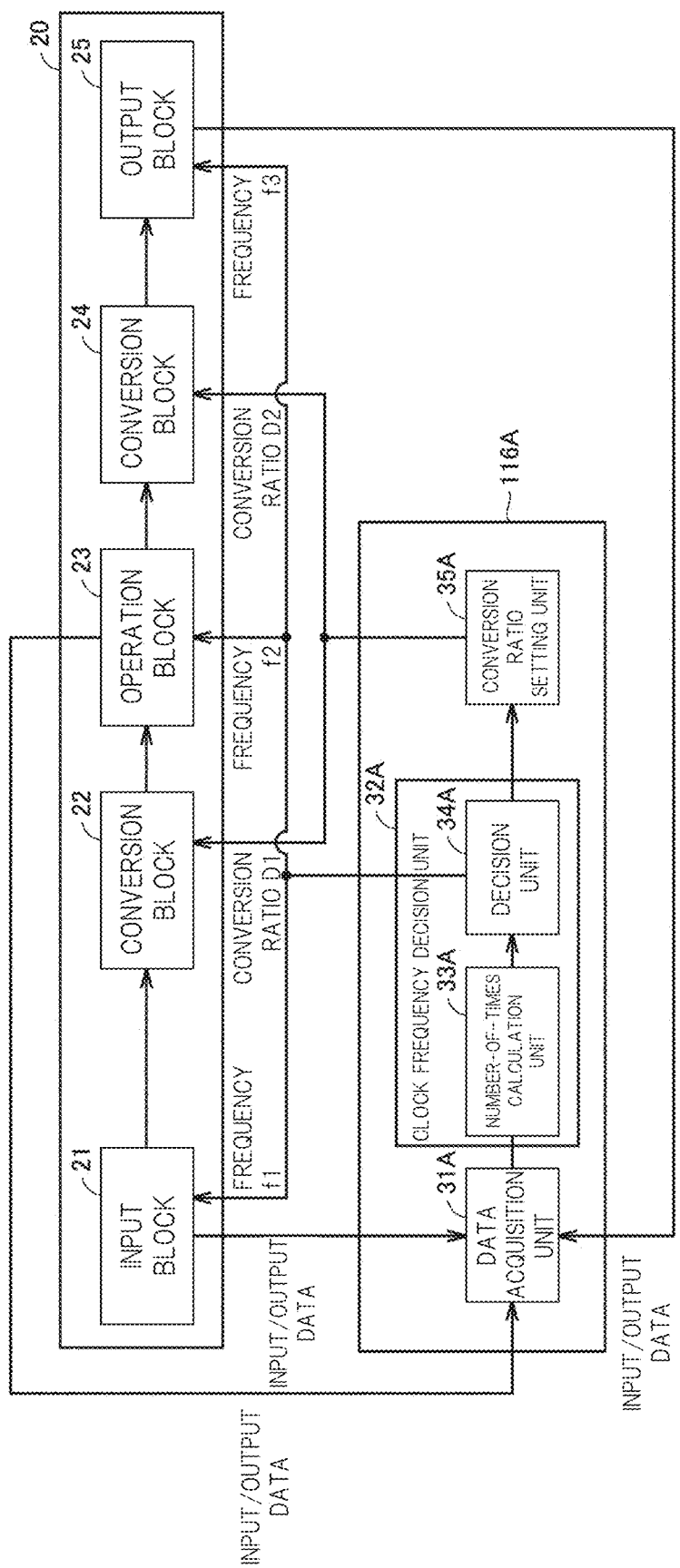
FIG. 3 is a block diagram for showing an example of a functional configuration of an improvement program according to a first embodiment.

FIG. 3 is a block diagram for showing an example of a functional configuration of an improvement program 116A according to a first embodiment. As main functional configurations realized by executing the improvement program 116A, an information processing device 100 includes a data acquisition unit 31A, a clock frequency decision unit 32A, and a conversion ratio setting unit 35A. Although the improvement program 116A corresponds to the improvement program 116 shown in FIG. 1, an additional sign "A" is attached for convenience sake to be distinguished from other embodiments. This also applies to second and third embodiments.

In addition, a model 20 loaded to a main storage device 110 includes an input block 21, conversion blocks 22 and 24, an operation block 23, and an output block 25. Although the model 20 corresponds to the model 114 shown in FIG. 1, a case in which one input block, one operation block, and one output block are provided will be described in order to simplify the explanation.

A data acquisition unit 31A acquires a simulation result of the model 20 in the case where a series of blocks including an input block 21, an operation block 23, and an output block 25 (hereinafter, also simply referred to as "a series of blocks") are allowed to operate at a predetermined clock frequency Fs (for example, 100 Hz). The predetermined clock frequency Fs is a frequency preliminarily set by a user with reference to the specifications and the like. Specifically, the data acquisition unit 31A acquires input/output data of each of the input block 21, the operation block 23, and the output block 25. Each input/output data is output to the clock frequency decision unit 32A.

The clock frequency decision unit 32A decides a new clock frequency of a target block allowed to operate at a clock frequency lower than the predetermined clock frequency Fs among a series of blocks on the basis of the acquired input/output data. Specifically, the clock frequency decision unit 32A includes a number-of-times calculation unit 33A and a decision unit 34A.

The number-of-times calculation unit 33A calculates the number of continuous times of the same input/output data (hereinafter, also simply referred to as "the number of continuous times") for each of a series of blocks by analyzing each input/output data. The calculation method by the number-of-times calculation unit will be concretely described using FIG. 4.

Figure 4:
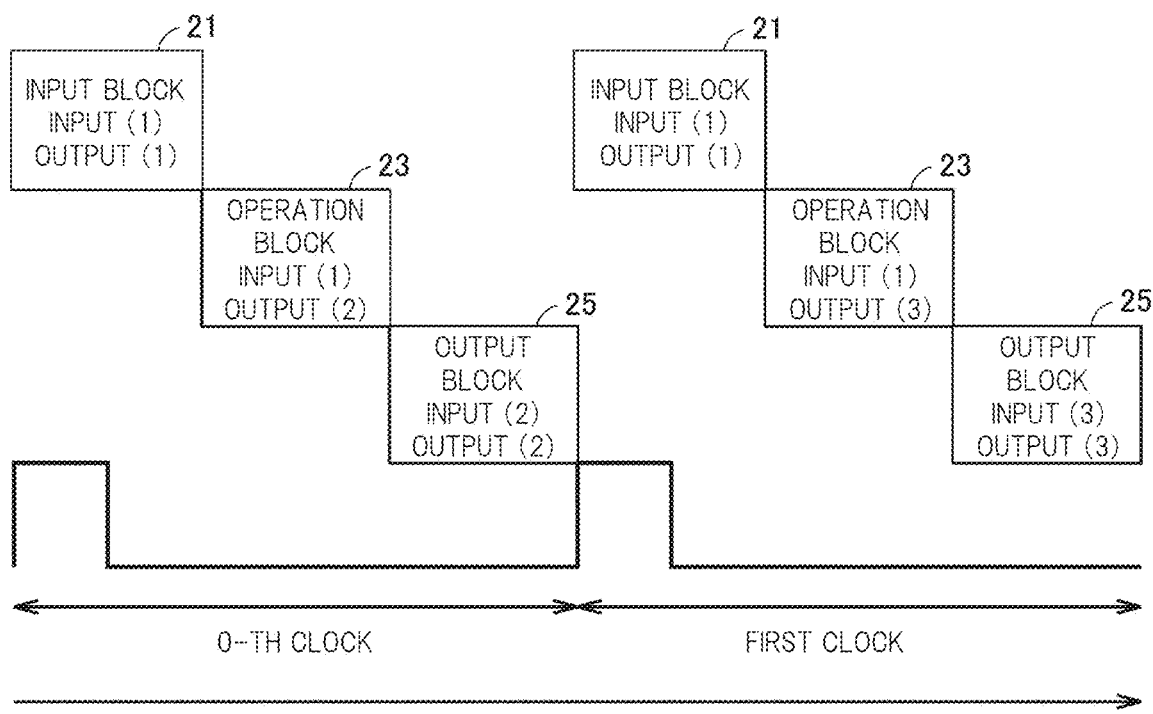
FIG. 4 is a diagram for explaining a calculation method by a number-of-times calculation unit according to the first embodiment.

FIG. 4 is a diagram for explaining the calculation method by the number-of-times calculation unit according to the first embodiment. In FIG. 4, the conversion blocks are not illustrated in order to easily understand the drawing because the conversion ratio of each of the conversion blocks 22 and 24 is "1". It should be noted that the input value and the output value of a block are expressed in the form of (input value, output value) in the following description.

With reference to FIG. 4, the input/output values of the input block 21 are (1, 1), the input/output values of the operation block 23 are (1, 2), and the input/output values of the output block 25 are (2, 2) in the 0-th clock. The input/output values of the input block 21 are (1, 1), the input/output values of the operation block 23 are (1, 3), and the input/output values of the output block 25 are (3, 3) in the first clock.

Accordingly, the input/output values of the input block 21 are the same between the 0-th clock and the first clock. Here, a case in which the input/output values of the input block 21 are changed to (2, 2) in the second clock and (2, 2) in the third clock, namely, a case in which the input/output values are the same between the 2n-th (n is an integer of 0 or larger) clock and the (2n+1)-th clock will be assumed. In this case, the number-of-times calculation unit 33A calculates the number of continuous times of the same input/output data as "2" for the input block 21.

On the other hand, the input/output data of the operation block 23 and the output block 25 are different from each other between the 0-th clock and the first clock. In this case, the number-of-times calculation unit 33A calculates the number of continuous times of the same input/output data as "1" for each of the operation block 23 and the output block 25.

With reference to FIG. 3 again, the decision unit 34A selects a target block allowed to operate at a clock frequency lower than the predetermined clock frequency Fs on the basis of the predetermined clock frequency Fs and the number of continuous times for each of a series of blocks, and decides the clock frequency of the selected target block. It should be noted that the clock frequency of the target block is a value obtained by dividing the predetermined clock frequency Fs by the number of continuous times for the target block.

Specifically, the decision unit 34A selects a block having "2" or larger of the number of continuous times as a target block. In the example of FIG. 4, only the input block 21 is selected as a target block. Here, since the number of continuous times is "2" in the example of FIG. 4, the simulation result is not changed even if the clock frequency of the input block 21 is changed to ½. Therefore, the decision unit 34A decides ½ of the predetermined clock frequency Fs as the clock frequency of the input block 21. As described above, the decision unit 34A decides a value obtained by dividing the predetermined clock frequency Fs (for example, 100 Hz) by the number of continuous times (for example, 2) as the new clock frequency (for example, 50 Hz) of the target block (for example, the input block 21).

In addition, the decision unit 34A decides the predetermined clock frequency Fs as the clock frequency of each of the operation block 23 and the output block 25. As described above, the present clock frequency is maintained for each block other than the target block without setting a new clock frequency.

The decision unit 34A outputs the decided clock frequency to each of a series of blocks. Specifically, the decision unit 34A outputs a clock frequency f1 to the input block 21, outputs a clock frequency f2 to the operation block 23, and outputs a clock frequency f3 to the output block 25. In the example of FIG. 4, the clock frequencies f1, f2, and f3 are Fs/2, Fs, and Fs, respectively.

The conversion ratio setting unit 35A sets the conversion ratio of each of the conversion blocks 22 and 24 in order to allow each of a series of blocks to appropriately operate at the clock frequency decided by the decision unit 34. Specifically, the conversion ratio setting unit 35A sets the conversion ratio of each of the conversion blocks 22 and 24 so that a simulation of the model 20 in which the target block is allowed to operate at the new clock frequency decided by the decision unit 34A and the remaining blocks other than the target block are allowed to operate at the predetermined clock frequency Fs is executed.

Here, a case in which the input block 21 is allowed to operate at the clock frequency f1, the operation block 23 is allowed to operate at the clock frequency f2, and the output block 25 is allowed to operate at the clock frequency f3 will be assumed. In this case, the conversion ratio setting unit 35A sets the conversion ratio D1 of the conversion block 22 as f1:f2 (namely, f2/f1), and sets the conversion ratio D2 of the conversion block 24 as f2:f3 (namely, f3/f2).

In detail, the operation block 23 coupled to the conversion block 22 coupled to the input block 21 executes a process after the input block 21. Accordingly, the conversion ratio setting unit 35A sets f2/f1 that is a ratio of the clock frequency f2 of the operation block 23 to the clock frequency f1 of the input block 21 as the conversion ratio of the conversion block 22.

In addition, since the output block 25 executes a process after the operation block 23, the conversion ratio setting unit 35A sets f3/f2 that is a ratio of the clock frequency f3 of the output block 25 to the clock frequency f2 of the operation block 23 as the conversion ratio of the conversion block 24. As described above, each block can be allowed to operate at the decided clock frequency by setting the conversion ratio.

Figure 5:
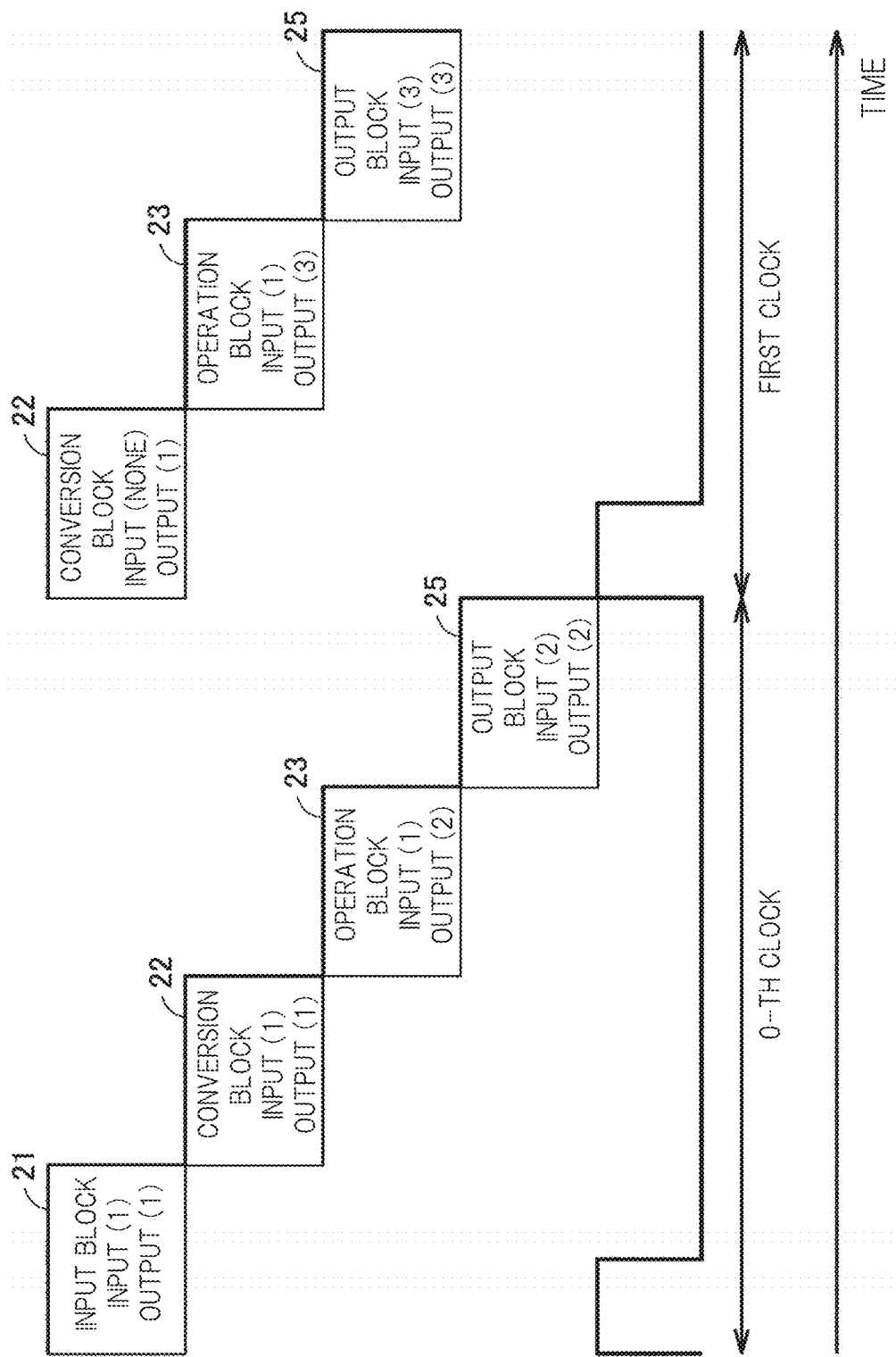
FIG. 5 is a diagram for explaining a reason of reduction in simulation time.

FIG. 5 is a diagram for explaining a reason of reduction in simulation time. In FIG. 5, it is assumed that the clock frequency f1 of the input block 21 is "Fs/2", the clock frequency f2 of the operation block 23 is "Fs", and the clock frequency f3 of the output block 25 is "Fs". Therefore, the conversion ratio of the conversion block 22 is "2". On the other hand, since the conversion ratio of the conversion block 24 is "1", the conversion block 24 is not illustrated in order to easily understand the drawing.

With reference to FIG. 5, the input/output values of the input block 21 are (1, 1), the input/output values of the conversion block 22 are (1, 1), the input/output values of the operation block 23 are (1, 2), and the input/output values of the output block 25 are (2, 2) in the 0-th clock.

Here, the conversion block 22 is configured to hold the output value of the input block 21 coupled to the input side and to output the held output value to the operation block 23 coupled to the output side. Therefore, the input/output values of the conversion block 22 are (none, 1) in the first clock. This means that the process of the input block 21 in which the clock frequency is set to Fs/2 is not executed, and the conversion block 22 holding the output value of the input block 21 outputs the output value to the operation block 23. Thus, the input/output values of the operation block 23 are (1, 3), and the input/output values of the output block 25 are (3, 3).

As shown in FIG. 5, it is not necessary to execute the process of the input block 21 in the first clock, and thus the simulation time can be reduced as compared to the 0-th clock. Specifically, it is not necessary to execute the process of the input block 21 in the (2n+1)-th clock, and thus the entire simulation time can be considerably reduced.

<Processing Procedure>

Figure 6:
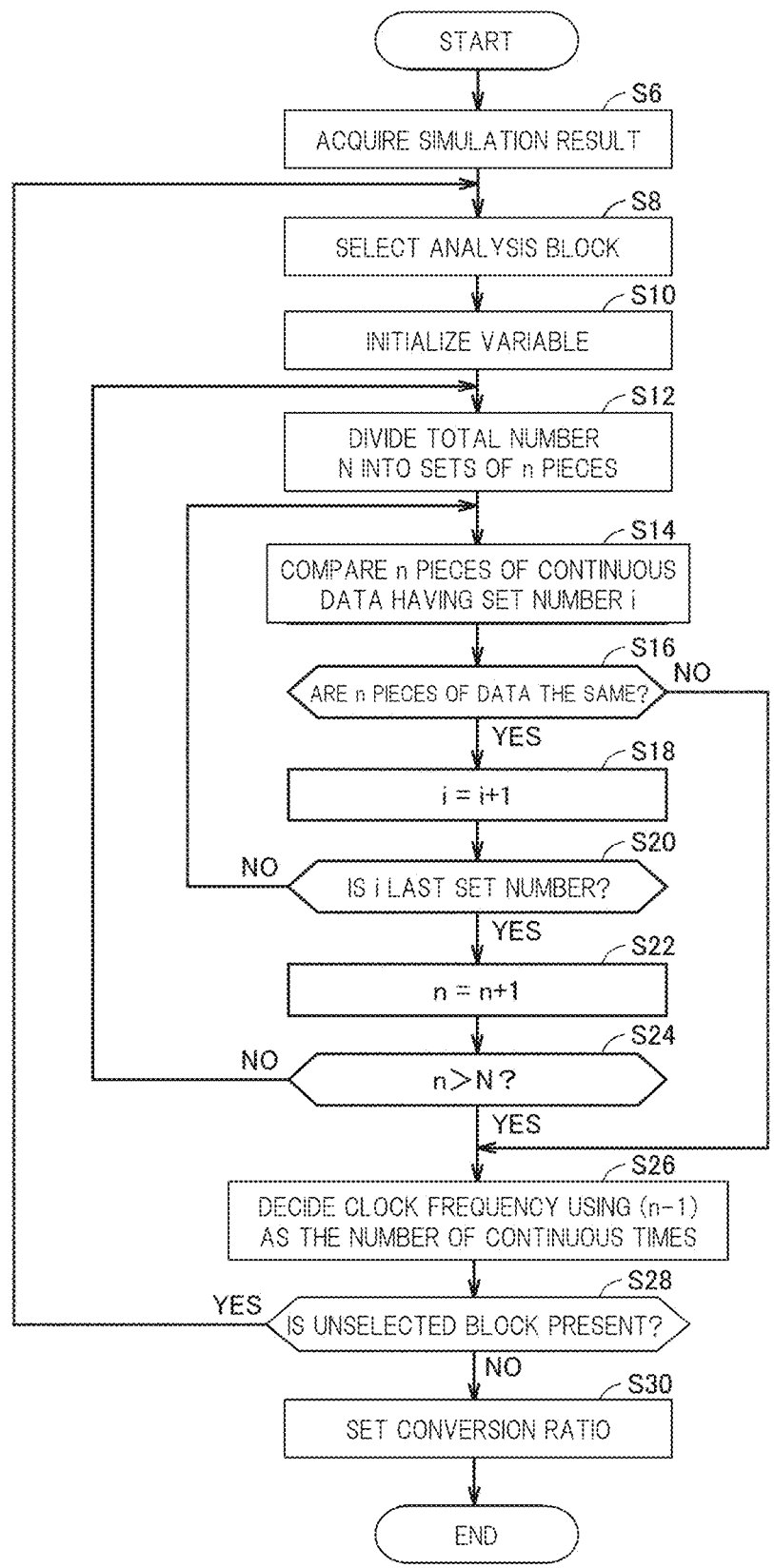
FIG. 6 is a flowchart for showing an example of a processing procedure of a processor according to the first embodiment.

FIG. 6 is a flowchart for showing an example of a processing procedure of the processor 102 according to the first embodiment. With reference to FIG. 6, the processor 102 executes a simulation of the model 20 in the case where a series of blocks are allowed to operate at the predetermined clock frequency Fs, and acquires the simulation result (Step S6).

The processor 102 selects a block to be analyzed from the series of blocks (Step S8). For example, the processor 102 first selects the input block 21 the processing order of which is the earliest. The block to be analyzed (hereinafter, also referred to as an "analysis block") may be arbitrarily selected.

The processor 102 initializes a variable related to the analysis block (Step S10). Specifically, the total number of pieces of input/output data is defined as N (N is an integer of 1 or larger), the number of pieces of input/output data per one set when dividing the total number N is defined as n (n is an integer of 1 or larger), and a set number is defined as i (i is an integer of 0 or larger). As initial values, the processor 102 substitutes the total number (for example, 6) of pieces of input/output data to N, substitutes 1 to n, and substitutes 0 to i.

The processor 102 divides the total number N into sets of n pieces (Step S12). For example, in the case where the total number N is "6", there are pieces of input/output data for six clocks. At this time, if n is "1", the total number N is divided into six sets of input/output data for 0-th to fifth clocks. In this case, since the number of sets is 6, the set numbers i are 0 to 5. In addition, if the total number N is "6" and n is "2", the total number N is divided into three sets of input/output data for the 0-th and first clocks, the second and third clocks, and the fourth and fifth clocks. In this case, since the number of sets is 3, the set numbers i are 0 to 2.

Next, the processor 102 compares n pieces of continuous input/output data having the set number i (Step S14). The processor 102 determines whether or not the n pieces of input/output data are the same on the basis of the comparison result (Step S16). For example, in the case where n is "1", the number of pieces of input/output data is only one, and thus it is determined as the same. In the case where n is "2", it is determined whether or not two pieces of input/output data (for example, the input/output data for the 0-th and first clocks) contained in one set are the same.

In the case where the n pieces of input/output data are not the same (NO in Step S16), a process of Step S26 to be described later is executed. In the case where the n pieces of input/output data are the same (YES in Step S16), the processor 102 increments the set number i (Step S18). Namely, the processor 102 increases the set number i by "1".

The processor 102 determines whether or not the set number i is the last set number (Step S20). In the case where the set number i is not the last set number (NO in Step S20), the processor 102 executes a process of Step S14. In the case where the set number i is the last set number (YES in Step S20), the number n of pieces of input/output data per one set is incremented (Step S22). Next, the processor 102 determines whether or not the number n of pieces of input/output data per one set is larger than the total number N (namely, n>N is satisfied) (Step S24).

In the case where n>N is not satisfied (NO in Step S24), the processor 102 executes a process of Step S12. In the case where n>N is satisfied (YES in Step S24), the processor 102 decides the clock frequency of the analysis block by using (n−1) times as the number of continuous times (Step S26). Specifically, the processor 102 decides a value obtained by dividing the predetermined clock frequency Fs by (n−1) as the clock frequency of the analysis block. It should be noted that since n is at least 2 or larger in Step S26, (n−1) is equal to or larger than 1.

The processor 102 determines whether or not a block that is not selected as the analysis block is present among the series of blocks (Step S28). In the case where the block is present (NO in Step S28), the processor 102 executes a process of Step S8. Namely, the processor 102 selects the unselected block as the analysis block, and executes the processes subsequent to Step S10.

In the case where the block is not present (NO in Step S28), the processor 102 sets the conversion ratios of the conversion blocks arranged among the blocks in order to allow each of the series of blocks to appropriately operate at the clock frequency decided for the block (Step S30), and completes the process.

<Advantage>

According to the first embodiment, since the clock frequencies of one or more blocks among a series of blocks are reduced, the simulation time can be reduced. In addition, since the clock frequency of a block is reduced in a range where the simulation result is not changed, the accuracy of the simulation result can be also secured without depending on a process inside a simulator such as a compiler. In addition, development and maintenance of both the simple model and the detailed model as described in Japanese Unexamined Patent Application Publication No. 2008-215254 are not necessary, and an increase in the capacity of a memory by storing the simple model and the detailed model into the memory does not occur. Further, complicated work of changing the configuration of the simple model in accordance with the reduction amount of simulation time is not necessary.

As described above, according to the first embodiment, the simulation time can be easily reduced without changing the execution result of the simulation in the model base development.

Second Embodiment

In a second embodiment, a configuration in which the clock frequency of each block is decided while confirming whether or not a simulation result obtained when the clock frequency of each block is reduced is within an allowable range will be described.

<Functional Configuration>

Figure 7:
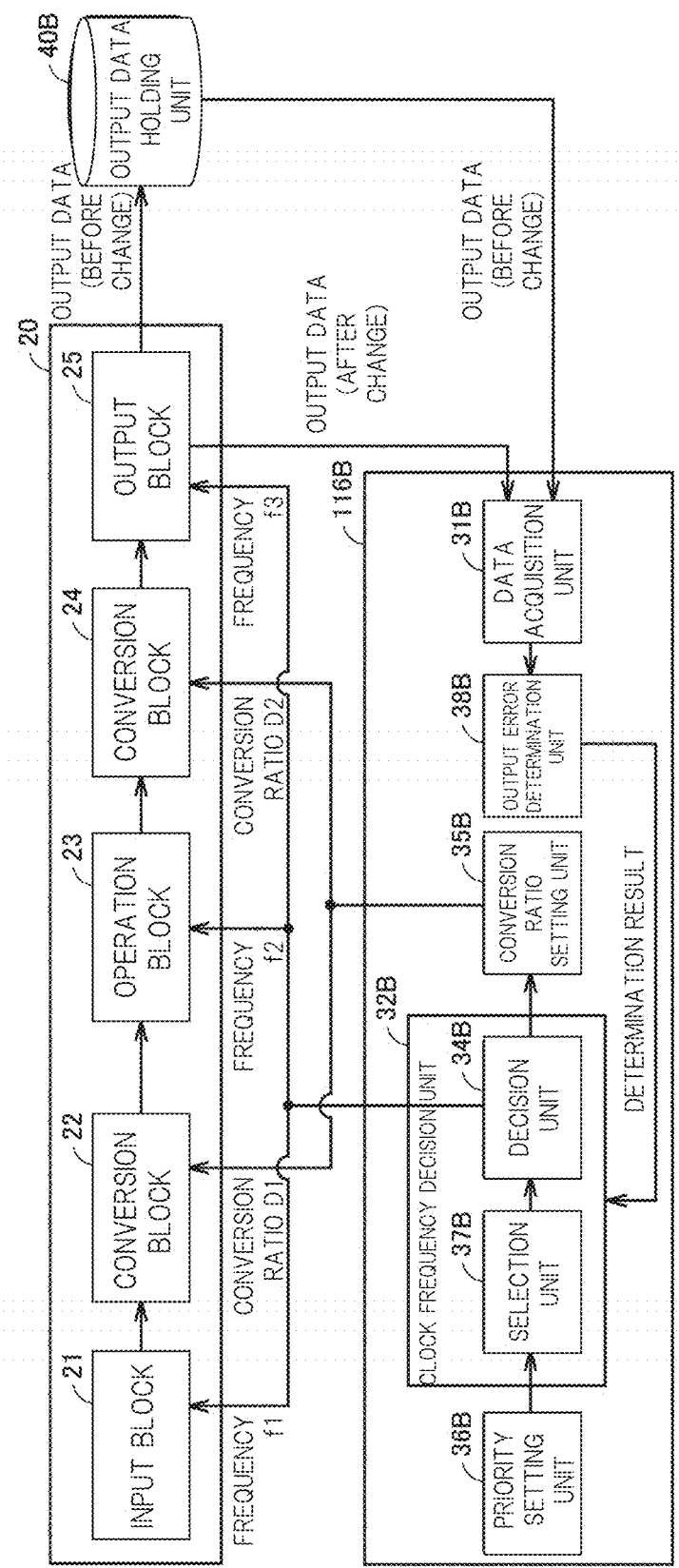
FIG. 7 is a block diagram for showing an example of a functional configuration of an improvement program according to a second embodiment.

FIG. 7 is a block diagram for showing an example of a functional configuration of an improvement program 116B according to the second embodiment. With reference to FIG. 7, as main functional configurations realized by executing the improvement program 116B, an information processing device 100 includes a data acquisition unit 31B, a clock frequency decision unit 32B, a conversion ratio setting unit 35B, a priority setting unit 36B, and an error determination unit 38B. In addition, the information processing device 100 further includes an output data holding unit 40B realized by a main storage device 110 and an auxiliary storage device 120.

The output data holding unit 40B holds a simulation result of a model 20 in the case where a series of blocks are allowed to operate at a predetermined clock frequency Fs. The simulation result includes output data of the model 20 for each clock (namely, output data of an output block 25 arranged in the last stage). The output data is an output expected value of the model 20. Specifically, the output expected value is output data Dbe of the model 20 before the clock frequency of the series of blocks is changed from the predetermined clock frequency Fs.

The priority setting unit 36B sets priority of the series of blocks. Specifically, as the processing order of a block among the series of blocks becomes later, the priority setting unit 36B sets higher priority. In the case of the model 20, a process is executed in the order of an input block 21, an operation block 23, and the output block 25 in the series of blocks. Therefore, the output block 25 is set to the highest priority, the operation block 23 is set to the second highest priority, and the input block 21 is set to the lowest priority.

On the basis of, at least, a simulation result of the model 20 in the case where the series of blocks are allowed to operate at the predetermined clock frequency Fs, the clock frequency decision unit 32B decides a new clock frequency for a target block that is allowed to operate at a clock frequency lower than the predetermined clock frequency Fs among the series of blocks. Specifically, the clock frequency decision unit 32B includes a decision unit 34B and a selection unit 37B.

On the basis of the priority set by the priority setting unit 36B, the selection unit 37B selects a target block BL1 that is allowed to operate at a clock frequency F1 (=Fs−k) lower than the predetermined clock frequency Fs by only a predetermined frequency k (for example, 1 Hz). Specifically, the selection unit 37B selects a block (for example, the output block 25) having the highest priority among the series of blocks as the first target block. As described above, in order to reduce the number of blocks affected by reducing the clock frequency, a block the processing order of which is later is preferentially selected as the target block.

The decision unit 34B tentatively decides the clock frequency F1 lower than the predetermined clock frequency Fs by only the predetermined frequency k as the clock frequency of the target block BL1. It should be noted that the decision unit 34B tentatively decides the predetermined clock frequency Fs as the clock frequency of the remaining blocks other than the target block BL1. The decision unit 34B outputs the tentatively-decided clock frequency to each of the series of blocks. For example, in the case where the target block BL1 is the output block 25, clock frequencies f1 and f2 are the predetermined clock frequencies Fs, and a clock frequency f3 is the clock frequency F1.

In order to allow each of the series of blocks to appropriately operate at the clock frequency tentatively decided by the decision unit 34B, the conversion ratio setting unit 35B sets the conversion ratios of conversion blocks 22 and 24. Specifically, the conversion ratio setting unit 35B sets the conversion ratios of the conversion blocks 22 and 24 so as to execute a simulation of the model 20 in which the target block BL1 is allowed to operate at the clock frequency F1 and the remaining blocks are allowed to operate at the predetermined clock frequency Fs.

As the simulation result of model 20 in the case where the target block BL1 is allowed to operate at the clock frequency F1 and the remaining blocks are allowed to operate at the predetermined clock frequency Fs, the data acquisition unit 31B acquires the output data of the model 20 for each clock from the output block 25. Namely, the data acquisition unit 31B acquires output data Daf of the model 20 for each clock after the clock frequency is changed.

In addition, the data acquisition unit 31B acquires the output expected value for each clock from the output data holding unit 40B. Namely, the data acquisition unit 31B acquires the output data Dbe of the model 20 for each clock.

The error determination unit 38B determines whether or not an error ΔD between the output data Daf and the output data Dbe for each clock is within a preliminarily-set allowable range. The allowable range is arbitrarily set by a user within a range where the simulation result is not substantially affected.

In the case where the error ΔD is within the allowable range, the following processes are executed. Specifically, the decision unit 34B tentatively decides a clock frequency F2 (=F1−k) that is much lower than the clock frequency F1 by only the predetermined frequency k as the clock frequency of the target block BL1, and tentatively decides the predetermined clock frequency Fs as the clock frequency of each of the remaining blocks. The conversion ratio setting unit 35B sets the conversion ratios of the conversion blocks 22 and 24 so as to execute a simulation of the model 20 in which the target block BL1 is allowed to operate at the clock frequency F2 and the remaining blocks are allowed to operate at the predetermined clock frequency Fs.

The data acquisition unit 31B acquires output data Daf1 of the model 20 for each clock in the case where the target block BL1 is allowed to operate at the clock frequency F2 and the remaining blocks are allowed to operate at the predetermined clock frequency Fs. The error determination unit 38B determines whether or not an error ΔD1 between the output data Daf1 and the output data Dbe for each clock is within the allowable range. Thereafter, the same processes are repeated.

On the other hand, in the case where the error ΔD is out of the allowable range, it means that the accuracy of the simulation result is not allowed, and thus the following processes are executed. The decision unit 34B decides the clock frequency of the target block BL1 as the predetermined clock frequency Fs (namely, formally decides the clock frequency). As described above, in order to secure the accuracy of the simulation result, the decision unit 34B employs not the clock frequency F1 tentatively decided as the clock frequency of the target block BL1 but the original predetermined clock frequency Fs.

The selection unit 37B selects a block having high priority next to the target block BL1 as a new target block BL2 that is allowed to operate at the clock frequency F1. For example, in the case where the original target block BL1 is the output block 25, the operation block 23 is selected as the target block BL2. The decision unit 34B tentatively decides the clock frequency of the target block BL2 as the clock frequency F1, and tentatively decides the predetermined clock frequency Fs as the clock frequency of the remaining blocks other than the target blocks BL1 and BL2. It should be noted that the predetermined clock frequency Fs is formally decided as the clock frequency of the target block BL1 as described above.

The conversion ratio setting unit 35B sets the conversion ratios of the conversion blocks 22 and 24 so as to execute a simulation of the model 20 in which the target block BL2 is allowed to operate at the clock frequency F1 and the remaining blocks other than the target block BL2 are allowed to operate at the predetermined clock frequency Fs. Thereafter, the same processes as the target block BL1 are repeated for the target block BL2.

As described above, the clock frequency of the target block is lowered until the simulation result becomes out of the allowable range, and the clock frequency tentatively decided immediately before the simulation result becomes out of the allowable range is formally decided as the clock frequency of the target block. In addition, in the case of the model (for example, the model 114 or the like) having a plurality of output blocks, the allowable range is set for each output block, and the allowable range is compared with an error.

<Processing Procedure>

Figure 8:
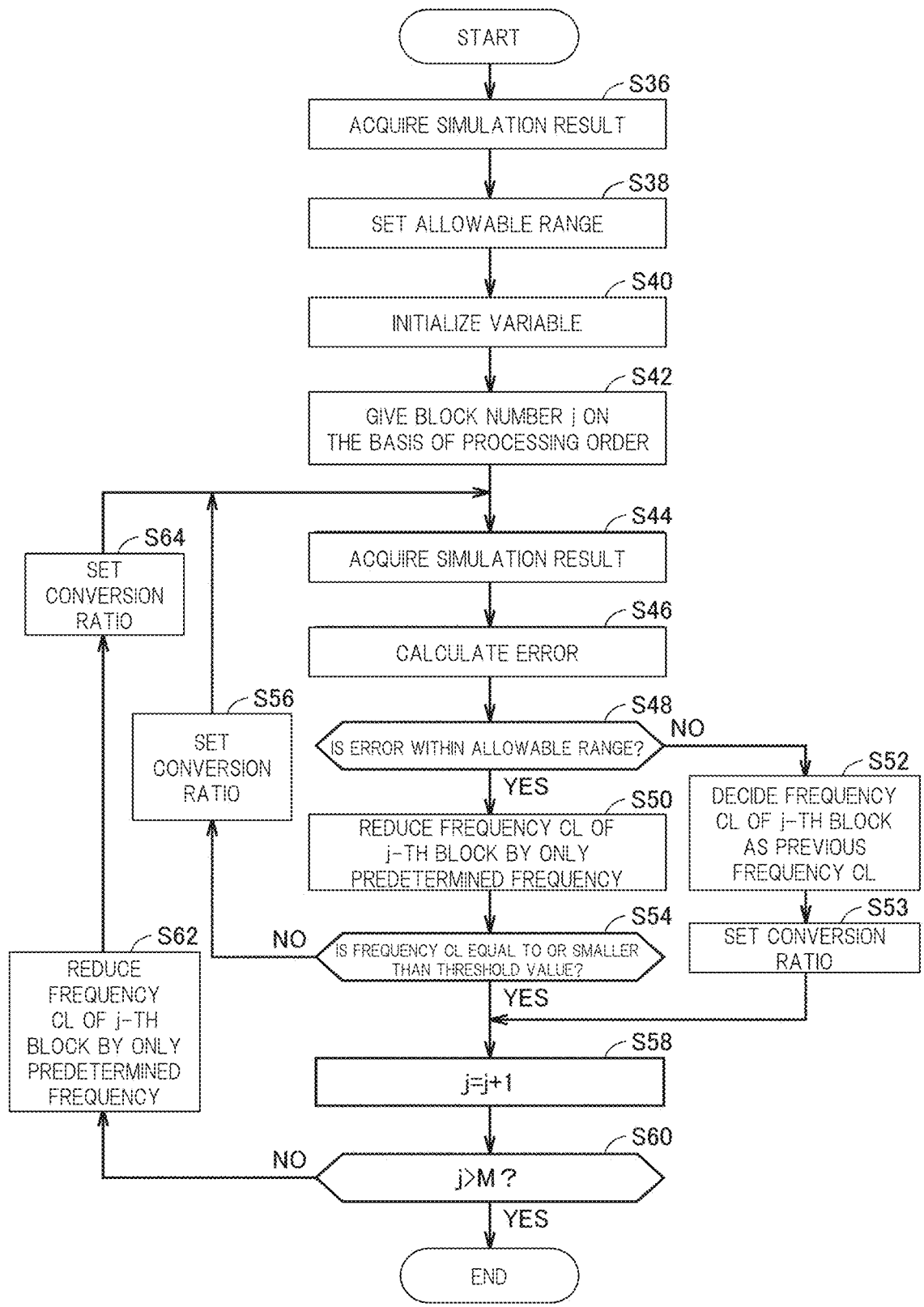
FIG. 8 is a flowchart for showing an example of a processing procedure of a processor according to the second embodiment.

FIG. 8 is a flowchart for showing an example of a processing procedure of a processor 102 according to the second embodiment. With reference to FIG. 8, the processor 102 acquires the simulation result of the model 20 in the case where a series of blocks are allowed to operate at the predetermined clock frequency Fs (Step S36). Specifically, the processor 102 stores the output data of the model 20 for each clock into the memory as the output expected value for each clock.

The processor 102 sets the allowable range of the output data of the model 20 (Step S38). It should be noted that in the case where a plurality of output blocks is included, the allowable range is set for the output data of each output block.

The processor 102 initializes a variable (Step S40). Specifically, the total number of blocks included in a processing route from the input block to the output block in the model 20 is defined as M, a block number is defined as j, and the clock frequency of a block is defined as CL. As initial values, the processor 102 substitutes the total number (for example, 3) of blocks to M, substitutes 0 to j, and substitutes the predetermined clock frequency Fs to CL.

The processor 102 gives a block number to each block on the basis of the priority according to the processing order of the model (Step S42). Specifically, the processor 102 gives the block numbers from the output block side of the processing route. For example, the block numbers j for the output block 25, the operation block 23, and the input block 21 are 0, 1, and 2, respectively.

The processor 102 executes a simulation of the model 20 by allowing each block to operate at the clock frequency that is currently set to each of a series of blocks (namely, the clock frequency tentatively or formally decided), and acquires the simulation result (Step S44). The processor 102 calculates an error for each clock between the output data of the model 20 on the basis of the simulation result and the output expected value (Step S46). The processor 102 determines whether or not the calculated error is within the allowable range (Step S48).

In the case where the error is within the allowable range (YES in Step S48), the processor 102 tentatively decides a clock frequency lowered by only the predetermined frequency k as the clock frequency CL of the j-th block (Step S50). The processor 102 determines whether or not the clock frequency CL is equal to or smaller than a threshold value (for example, 1 Hz) (Step S54).

In the case where the clock frequency CL is equal to or smaller than the threshold value (YES in Step S54), a process of Step S58 to be described later is executed. In the case where the clock frequency CL is larger than the threshold value (NO in Step S54), the processor 102 sets the conversion ratios of the conversion blocks arranged among the blocks in order to allow the j-th block to operate at the tentatively-decided clock frequency CL and to allow the remaining blocks to operate at the currently-set clock frequency (Step S56). Next, the processor 102 executes a simulation in Step S44.

On the other hand, in the case where the error is out of the allowable range in Step S48 (NO in Step S48), the processor 102 formally decides the clock frequency CL of the j-th block as the clock frequency CL that was tentatively decided last time (Step S52). Next, the processor 102 sets the conversion ratios of the conversion blocks arranged among the blocks in order to allow the j-th block to operate at the formally-decided clock frequency CL and to allow the remaining blocks to operate at the currently-set clock frequency (Step S53).

Next, the processor 102 increments the block number j (Step S58). Namely, the processor 102 increases the block number j by "1". Accordingly, the target block whose clock frequency is reduced is changed. The processor 102 determines whether or not the block number j is larger than the block total number M (namely, j>M is satisfied) (Step S60).

In the case where j>M is not satisfied (NO in Step S60), the processor 102 tentatively decides a clock frequency lowered by only the predetermined frequency k as the clock frequency CL of the j-th block (Step S62). Next, the processor 102 sets the conversion ratios of the conversion blocks in order to allow the j-th block to operate at the tentatively-decided clock frequency CL and to allow the remaining blocks to operate at the currently-set clock frequency (Step S64), and executes a simulation in Step S44.

On the other hand, in the case where j>M is satisfied (YES in Step S60), the processor 102 completes the process. Namely, the processor 102 formally decides the clock frequency of each block of the series of blocks, and completes the process after setting the conversion ratio on the basis of the formally-decided clock frequency.

<Advantage>

According to the second embodiment, since the clock frequencies of one or more blocks among a series of blocks are reduced, the simulation time can be reduced. In addition, since the clock frequency of a block is reduced within an allowable range although the simulation result is slightly changed, the accuracy of the simulation result can be also secured.

Third Embodiment

In the second embodiment, a configuration in which priority is set on the basis of the processing order of each block has been described. However, in a third embodiment, a configuration in which priority is set on the basis of the fluctuation rate of output data of each block will be described.

<Functional Configuration>

Figure 9:
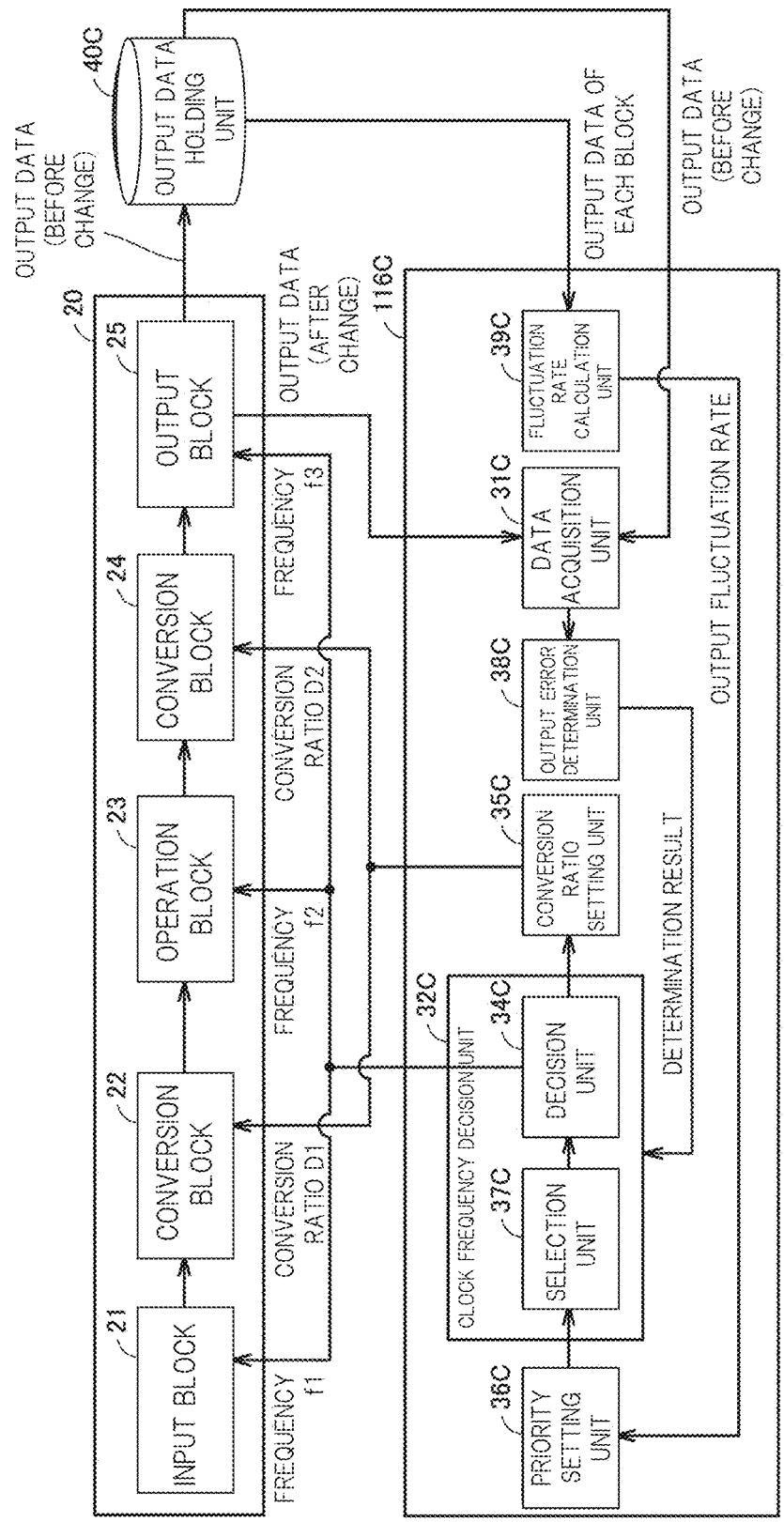
FIG. 9 is a block diagram for showing an example of a functional configuration of an improvement program according to a third embodiment.

FIG. 9 is a block diagram for showing an example of a functional configuration of an improvement program 116C according to a third embodiment. As main functional configurations realized by executing the improvement program 116C, an information processing device 100 includes a data acquisition unit 31C, a clock frequency decision unit 32C, a conversion ratio setting unit 35C, a priority setting unit 36C, an error determination unit 38C, and a fluctuation rate calculation unit 39C. The clock frequency decision unit 32C includes a decision unit 34C and a selection unit 37C. The data acquisition unit 31C, the clock frequency decision unit 32C, the conversion ratio setting unit 35C, and the error determination unit 38C are substantially the same as the data acquisition unit 31B, the clock frequency decision unit 32B, the conversion ratio setting unit 35B, and the error determination unit 38B in FIG. 7, respectively.

As similar to the second embodiment, an output data holding unit 40C includes output data Dbe of a model 20 for each clock in the case where a series of blocks are allowed to operate at a predetermined clock frequency Fs. The output data holding unit 40C further includes output data of each block in the case where the series of blocks are allowed to operate at the predetermined clock frequency Fs.

The fluctuation rate calculation unit 39C calculates the output fluctuation rate of each block on the basis of the waveform of output data of each block stored in the output data holding unit 40C.

Figure 10A:
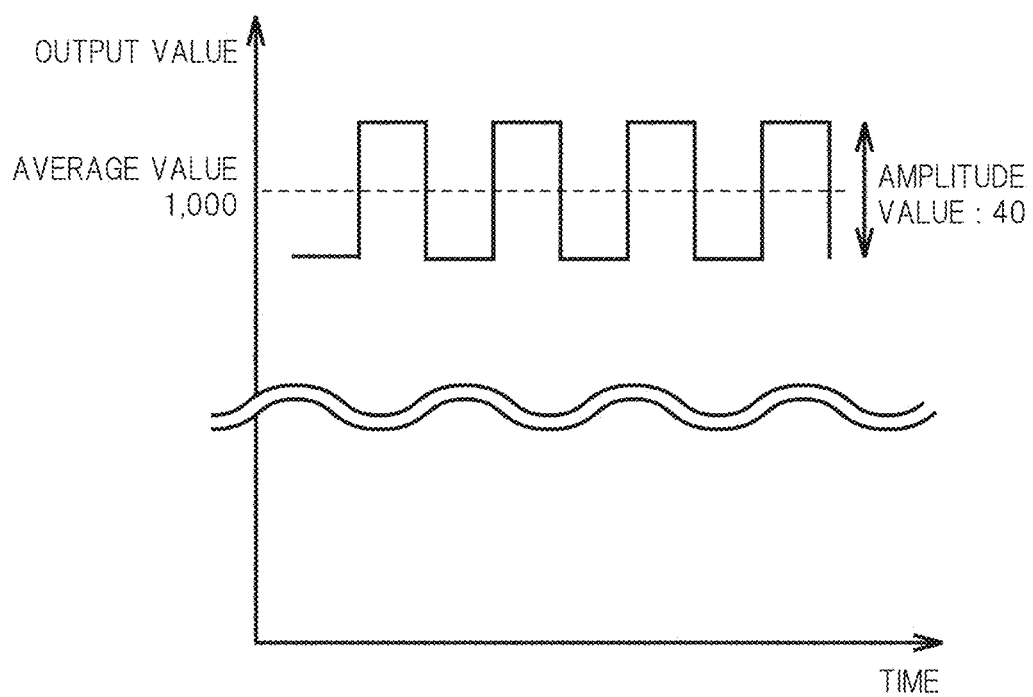
FIGS. 10A and 10B are diagrams each explaining a calculation method of an output fluctuation rate according to the third embodiment.
Figure 10B:
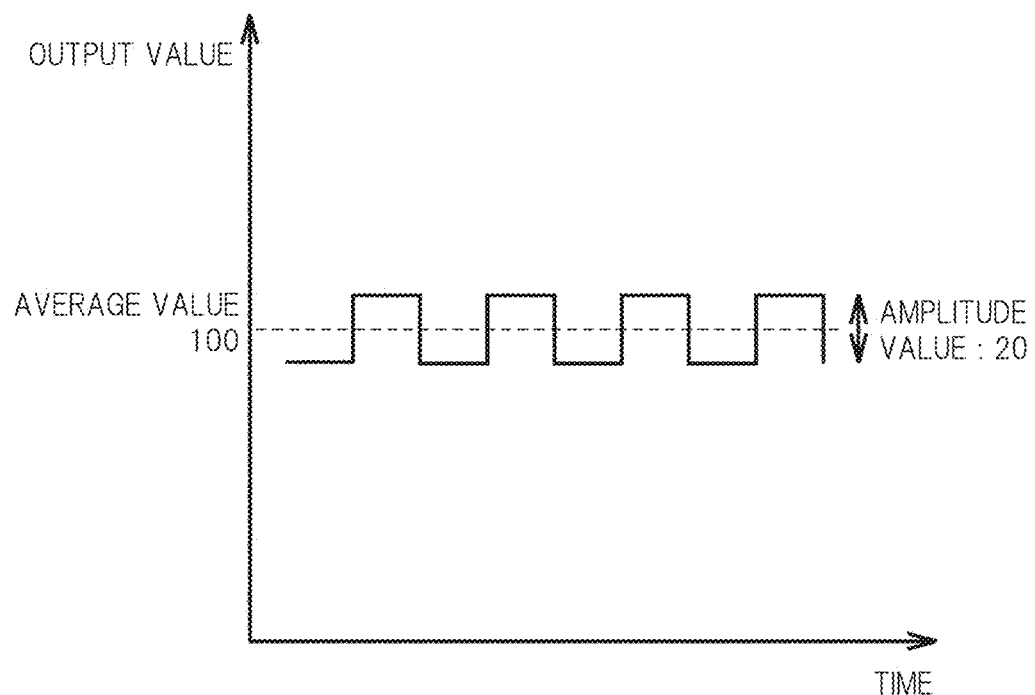

FIGS. 10A and 10B are diagrams each explaining a calculation method of the output fluctuation rate according to the third embodiment. Specifically, FIG. 10A is a diagram for showing an example of the waveform of the output data. FIG. 10B is a diagram for showing another example of the waveform of the output data. Here, the output fluctuation rate is the amplitude value of output data for the average value of output values of the output data. In the case of the output data of FIG. 10A, the output fluctuation rate is 0.04 (=40/1000). In the case of the output data of FIG. 10B, the output fluctuation rate is 0.2 (=20/100). Therefore, the output fluctuation rate of the block having the output data shown in FIG. 10A is smaller than that shown in FIG. 10B, and an output error is regarded to be small.

With reference to FIG. 9 again, the priority setting unit 36C sets priority of a series of blocks on the basis of the output fluctuation rate of each of the series of blocks. Specifically, as the output fluctuation rate of a block among the series of blocks becomes smaller, the priority setting unit 36C sets higher priority. Therefore, the priority of the block having the output data shown in FIG. 10A is set higher than that shown in FIG. 10B.

In addition, a block having high priority is selected as a first target block by the selection unit 37C. As described above, since an output error when reducing the clock frequency is small, a block having a small output fluctuation rate is preferentially selected as the target block.

<Processing Procedure>

FIG. 11 is a flowchart for showing an example of a processing procedure of a processor 102 according to the third embodiment. With reference to FIG. 11, the processes of Steps S66 to S70 are the same as those of Step S36 to Step S40 in FIG. 8, and thus the detailed explanation thereof will not be repeated. The processor 102 calculates the output fluctuation rate of each block on the basis of the output data of each block in the case where the series of blocks are allowed to operate at the predetermined clock frequency Fs (Step S71).

Next, the processor 102 gives a block number to each block on the basis of the priority according to the output fluctuation rate of each block (Step S72). Specifically, the processor 102 gives the block number staring from a block having a smaller output fluctuation rate. For example, in the case where the output fluctuation rates become smaller (namely, the priority becomes higher) in the order of an operation block 23, an input block 21, and an output block 25, the block numbers j of the operation block 23, the input block 21, and the output block 25 are 0, 1, and 2, respectively.

The processes of Step S74 to Step S94 are the same as those of Step S44 to Step S64 in FIG. 8, and thus the detailed explanation thereof will not be repeated.

<Advantage>

According to the third embodiment, since the clock frequency of each block is reduced within an allowable range, the simulation time can be reduced, and the accuracy of the simulation result can be also secured as similar to the second embodiment. Further, in the third embodiment, time required to select a target block to reduce the clock frequency can be shortened.

[Other]

A program that executes the control as described in the above flowcharts can be provided as a program product by being recorded into non-transitory computer readable recording media such as a flexible disk, a CD-ROM (Compact Disk Read Only Memory), a ROM, a RAM, and a memory card attached to a computer. Alternatively, the program can be also provided by being recorded into a recording medium such as a hard disk incorporated in a computer. Further, the program can be also provided by being downloaded via a network.

In the above-described embodiments, the processes and configurations described in the other embodiments may be appropriately employed and carried out.

The invention achieved by the inventors has been concretely described above on the basis of the embodiments. However, it is obvious that the present invention is not limited to the above-described embodiments, and can be variously changed without departing from the scope thereof.

What is claimed is:

1. A computer readable storage medium storing a program to be executed in an information processing device including a processor and a memory,
wherein the memory stores a model including a series of blocks and conversion blocks arranged among the series of blocks,
wherein each of the conversion blocks is configured to convert a clock frequency of a block coupled to an input side of the conversion block at a set conversion ratio and to output the converted clock frequency to an output side of the conversion block, and
wherein the program stored in the computer readable storage medium allows the processor to execute the steps of:
acquiring a first simulation result of a first simulation of the model in which the conversion ratios of the conversion blocks arranged among the series of blocks are set such that the series of blocks are allowed to operate at a predetermined clock frequency in the first simulation; and
setting the conversion ratios of the conversion blocks arranged among the blocks of the series of blocks so as to execute a second simulation of the model in which a target block is allowed to operate at a new clock frequency lower than the predetermined clock frequency on a basis of the first simulation result.

2. The computer readable storage medium according to claim 1, wherein the program stored in the computer readable storage medium further allows the processor to execute deciding the new clock frequency of the target block that is allowed to operate at the clock frequency lower than the predetermined clock frequency among the series of blocks on the basis of the first simulation result.

3. The computer readable storage medium according to claim 2, wherein the remaining blocks other than the target block among the series of blocks are allowed to operate at the predetermined clock frequency in the second simulation of the model.

4. The computer readable storage medium according to claim 3,
wherein the series of blocks comprising an input block, one or more operation blocks, and an output blocks on a processing route from the input block to the output block via the one or more operation blocks,
wherein the input block accepts data from outside of the model,
wherein the one or more operation blocks executes predetermined operations respectively, and
wherein the output block outputs data to the outside of the model.

5. The computer readable storage medium according to claim 4, wherein the step of setting includes a step of, in the case where another block coupled to a first conversion block coupled to the target block executes a process after the target block, setting a ratio of the clock frequency of the another block to the clock frequency of the target block as the conversion ratio of the first conversion block.

6. The computer readable storage medium according to claim 5, wherein the step of setting includes a step of, in the case where the another block executes a process before the target block, setting a ratio of the clock frequency of the target block to the clock frequency of the another block as the conversion ratio of the first conversion block.

7. The computer readable storage medium according to claim 4, wherein the conversion block is configured to hold output data of a block coupled to the input side and to output the held output data to a block coupled to the output side.

8. The computer readable storage medium according to claim 4,
wherein the first simulation result includes input/output data for a clock of each of the series of blocks, and
wherein the step of deciding includes a step of calculating the number of continuous times of the same input/output data for each of the series of blocks by analyzing the acquired input/output data of each block and a step of deciding the clock frequency of the target block on the basis of the predetermined clock frequency and the number of times for each of the series of blocks.

9. The computer readable storage medium according to claim 8, wherein the clock frequency of the target block is a value obtained by dividing the predetermined clock frequency by the number of times for the target block.

10. The computer readable storage medium according to claim 4,
wherein the first simulation result includes first output data of the model for a clock of each of the series of blocks in the case where the series of blocks are allowed to operate at the predetermined clock frequency, and
wherein the computer readable storage medium allow the processor to further execute the steps of:
setting priority of the series of blocks;
selecting a first target block that is allowed to operate at a first clock frequency lower than the predetermined clock frequency by a predetermined frequency on the basis of the set priority;
acquiring second output data of the model for each clock as a second simulation result of the model in the case where the first target block is allowed to operate at the first clock frequency and the remaining blocks other than the first target block are allowed to operate at the predetermined clock frequency; and
determining whether or not an error between the first output data and the second output data is within an allowable range.

11. The computer readable storage medium according to claim 10, wherein in the case where the error is within the allowable range, the step of setting includes a step of setting the conversion ratios of the conversion blocks arranged among the blocks so as to execute a third simulation of the model in which the first target block is allowed to operate at a second clock frequency lower than the first clock frequency by only the predetermined frequency and the remaining blocks other than the first target block are allowed to operate at the predetermined clock frequency.

12. The computer readable storage medium according to claim 10, wherein in the case where the error is not within the allowable range, the step of deciding includes a step of deciding the clock frequency of the first target block as the predetermined clock frequency, and the step of selecting includes a step of selecting a block having high priority next to the first target block as a second target block that is allowed to operate at the first clock frequency.

13. The computer readable storage medium according to claim 12, wherein the step of setting includes a step of setting the conversion ratios of the conversion blocks arranged among the blocks so as to execute a fourth simulation of the model in the case where the second target block is allowed to operate at the first clock frequency and the remaining blocks other than the second target block are allowed to operate at the predetermined clock frequency.

14. The computer readable storage medium according to claim 10, wherein in the step of setting priority, as the processing order of a block among the series of blocks becomes later, the priority is set higher.

15. The computer readable storage medium according to claim 10,
wherein the first simulation result further includes output data of each block when the series of blocks are allowed to operate at the predetermined clock frequency,
wherein the computer readable storage medium allows the processor to further execute a step of calculating an output fluctuation rate of a block on the basis of a waveform of output data of the block among the series of blocks, and
wherein the step of setting priority includes a step of setting priority of the series of blocks on the basis of the output fluctuation rate.

16. The computer readable storage medium according to claim 15, wherein in the step of setting priority, as the output fluctuation rate of a block among the series of blocks becomes smaller, the priority is set higher.

17. The computer readable storage medium according to claim 16, wherein the output fluctuation rate is an amplitude value of the output data for an average value of output values of the output data.

18. An information processing device comprising:
a processor; and
a memory that stores a model including a series of blocks having an input block, one or more operation blocks, and an output block and conversion blocks arranged among the series of blocks,
wherein the conversion block is configured to convert a clock frequency of a block coupled to an input side at a set conversion ratio and to output the converted frequency, and
wherein the processor:
acquires a simulation result of a first simulation of the model in which the conversion ratios of the conversion blocks arranged among the blocks are set such that the series of blocks are allowed to operate at a predetermined clock frequency in the first simulation;
decides a new clock frequency of a target block that is allowed to operate at a clock frequency lower than the predetermined clock frequency among the series of blocks on a basis of the simulation result of the first simulation; and
sets the conversion ratios of the conversion blocks arranged among the blocks so as to execute a second simulation of the model in which the target block is allowed to operate at the new clock frequency lower than the predetermined clock frequency and the remaining blocks other than the target block among the series of blocks are allowed to operate at the predetermined clock frequency.

19. An information processing method executed by a processor of an information processing device,
wherein the information processing device includes a memory that stores a model including a series of blocks having an input block, one or more operation blocks, and an output block and conversion blocks arranged among the series of blocks, and wherein each of the conversion block is configured to convert a clock frequency of a block coupled to an input side at a set conversion ratio and to output the converted clock frequency, the method comprising the steps of:

acquiring a simulation result of a first simulation of the model in which the conversion ratios of the conversion blocks arranged among the blocks are set such that the series of blocks are allowed to operate at a predetermined clock frequency in the first simulation;

deciding a new clock frequency of a target block that is allowed to operate at a clock frequency lower than the predetermined clock frequency among the series of blocks on the basis of the simulation result of the first simulation; and setting the conversion ratios of the conversion blocks arranged among the blocks so as to execute a second simulation of the model in which the target block is allowed to operate at the new clock frequency lower than the predetermined clock frequency and the remaining blocks other than the target block among the series of blocks are allowed to operate at the predetermined clock frequency.

\* \* \* \* \*